United States Patent
Moon

(10) Patent No.: US 10,914,786 B2
(45) Date of Patent: Feb. 9, 2021

(54) TEST MODE SET CIRCUIT AND METHOD OF SEMICONDUCTOR DEVICE

(71) Applicant: SK hynix Inc., Gyeonggi-do (KR)

(72) Inventor: Hong-Ki Moon, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 345 days.

(21) Appl. No.: 15/982,422

(22) Filed: May 17, 2018

(65) Prior Publication Data

US 2019/0128959 A1     May 2, 2019

(30) Foreign Application Priority Data

Oct. 30, 2017 (KR) ........................ 10-2017-0142508

(51) Int. Cl.
| | |
|---|---|
| G01R 31/3183 | (2006.01) |
| G11C 17/16 | (2006.01) |
| G11C 29/10 | (2006.01) |
| G01R 31/28 | (2006.01) |
| G11C 29/46 | (2006.01) |
| G11C 29/04 | (2006.01) |
| G11C 29/44 | (2006.01) |

(52) U.S. Cl.
CPC ..... *G01R 31/3183* (2013.01); *G01R 31/2882* (2013.01); *G11C 17/16* (2013.01); *G11C 29/10* (2013.01); *G11C 29/46* (2013.01); *G11C 2029/0407* (2013.01); *G11C 2029/4402* (2013.01)

(58) Field of Classification Search
CPC  G01R 31/3183; G01R 31/2882; G11C 17/16; G11C 29/10; G11C 29/46; G11C 2029/0407; G11C 2029/4402
See application file for complete search history.

(56) References Cited

U.S. PATENT DOCUMENTS

| | | | | |
|---|---|---|---|---|
| 2007/0171738 | A1* | 7/2007 | Kim | G11C 29/14 365/201 |
| 2012/0002494 | A1* | 1/2012 | Kim | G11C 29/46 365/201 |
| 2012/0119764 | A1* | 5/2012 | Yun | G11C 29/46 324/750.01 |
| 2012/0131397 | A1* | 5/2012 | Yoshida | G11C 29/16 714/718 |
| 2014/0223245 | A1* | 8/2014 | Woo | G11C 29/36 714/718 |
| 2015/0294736 | A1* | 10/2015 | Shim | G11C 17/18 365/96 |

FOREIGN PATENT DOCUMENTS

| | | |
|---|---|---|
| KR | 1020140029089 | 3/2014 |
| KR | 1020150071470 | 6/2015 |

* cited by examiner

*Primary Examiner* — Raymond L Nimox
(74) *Attorney, Agent, or Firm* — IP & T Group LLP

(57) ABSTRACT

A test mode set circuit includes: a first test mode set block suitable for setting entry into a first test mode based on a clock signal and first data outputted from a non-volatile memory during a first period of a boot-up operation; and a second test mode set block suitable for setting entry into a second test mode based on the first data and second data outputted from the non-volatile memory during a second period of the boot-up operation, or setting entry into the second test mode based on a set signal generated by a combination of a command and an address during a normal operation.

19 Claims, 9 Drawing Sheets

FIG. 8

| MODE | FUSE TEST MODE | | NORMAL TEST PERIOD | |
|---|---|---|---|---|
| OPERATION PERIOD | BOOT-UP OPERATION | | BOOT-UP OPERATION | NORMAL OPERATION |
| | FIRST PERIOD | - | SECOND PERIOD | IDLE STATE |
| TMGRPSET0 | FZCLK | | - | - |
| TMGRPSET1 | - | | FZCLK | TMGRPSET1_MRS |
| TCM<0:4> | FDATA(FD0) | | FDATA(FD0) | TCN_MRS<0:4> |
| TANL<0:6> | FZCLK(CNT<0:6>) | | FDATA(FD1) | TANL_MRS<0:6> |

TEST MODE SET CIRCUIT AND METHOD OF SEMICONDUCTOR DEVICE

CROSS-REFERENCE TO RELATED APPLICATIONS

This application claims priority under 35 U.S.C. § 119 to Korean Patent Application No. 10-2017-0142508, filed on Oct. 30, 2017, which is incorporated herein by reference in its entirety.

BACKGROUND

1. Field

Various exemplary embodiments of the present invention relate to a semiconductor device. Particularly, various exemplary embodiments relate to a test mode set circuit of a semiconductor device and a method of setting a test mode.

2. Description of the Related Art

Generally, a semiconductor device stores test results obtained by testing internal circuit blocks in the test mode, and operates the internal circuit blocks based on pre-stored test results in the normal mode, A semiconductor device determines whether or not to enter the test mode based on each distinct test mode signal, and performs a test operation according to the designer's intention.

Various research on the method of setting a test mode that can be performed in various environments have been conducted. For example, in order to initiate the test mode, a test mode signal may be set based on fuse data permanently stored in a non-volatile memory such as a fuse circuit, or a test mode signal may be set based on a mode register set (MRS) code which is set according to a combination of a command and an address inputted from an external device.

SUMMARY

Various embodiments of the present invention are directed to a test mode set circuit of a semiconductor device capable of set a test mode during a boot-up operation as well as a normal operation, and a method of setting the test mode.

In accordance with an embodiment of the present invention, a test mode set circuit includes: a first test mode set block suitable for setting entry into a first test mode based on a clock signal and first data outputted from a non-volatile memory during a first period of a boot-up operation; and a second test mode set block suitable for setting entry into a second test mode based on the first data and second data outputted from the non-volatile memory during a second period of the boot-up operation, or setting entry into the second test mode based on a set signal generated by a combination of a command and an address during a normal operation.

In accordance with an embodiment of the present invention, a semiconductor device includes: a non-volatile memory suitable for outputting fuse data that is programmed based on a clock signal during a boot-up operation; a mode set circuit suitable for outputting a set control signal, first set code signals and second set code signals that are stored according to a combination of a command and an address during a normal operation; a first code output block suitable for outputting the first set code signals or the fuse data as first code signals; a second code output block suitable for generating count signals by counting the clock signal during the boot-up operation, selecting one of the count signals and the fuse data and outputting the one as second code signals based on a counting termination signal, and outputting the second set code signals as the second code signals during the normal operation; a test set control block suitable for outputting the clock signal as a first control signal or a second control signal based on the counting termination signal during the boot-up operation and outputting the set control signal as the second control signal during the normal operation; and a test mode set circuit suitable for controlling entry into a first test mode or a second test mode according to the first code signals and the second code signals that are decoded based on the first control signal and the second control signal.

In accordance with an embodiment of the present invention, a method of setting a test mode includes: setting entry into a first test mode based on count signals generated by counting a clock signal and first data outputted from a non-volatile memory during a first period of a boot-up operation; activating a counting termination signal when the count signals reach a specific value; setting entry into a second test mode based on the first data and second data outputted from the non-volatile memory during a second period of the boot-up operation based on the counting termination signal; and setting re-entry into the second test mode based on a set signal generated according to a combination of a command and an address during a normal operation.

BRIEF DESCRIPTION OF THE DRAWINGS

FIG. 8 is a table for describing a method of setting a test mode of a semiconductor device in accordance with an embodiment of the present invention.

DETAILED DESCRIPTION

Various embodiments of the present invention will be described below in more detail with reference to the accompanying drawings. These embodiments are provided so that this disclosure is thorough and complete. All "embodiments" referred to in this disclosure refer to embodiments of the inventive concept disclosed herein. The embodiments presented are merely examples and are not intended to limit the scope of the invention. It is noted that reference to "an embodiment" does not necessarily mean only one embodiment, and different references to "an embodiment" are not necessarily to the same embodiment(s).

Moreover, it is noted that the terminology used herein is for the purpose of describing the embodiments only and is not intended to be limiting of the invention. As used herein, singular forms are intended to include the plural forms as well, unless the context clearly indicates otherwise. It will be further understood that the terms "comprises, " "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly is illustrate features of the embodiments.

Figure 1:
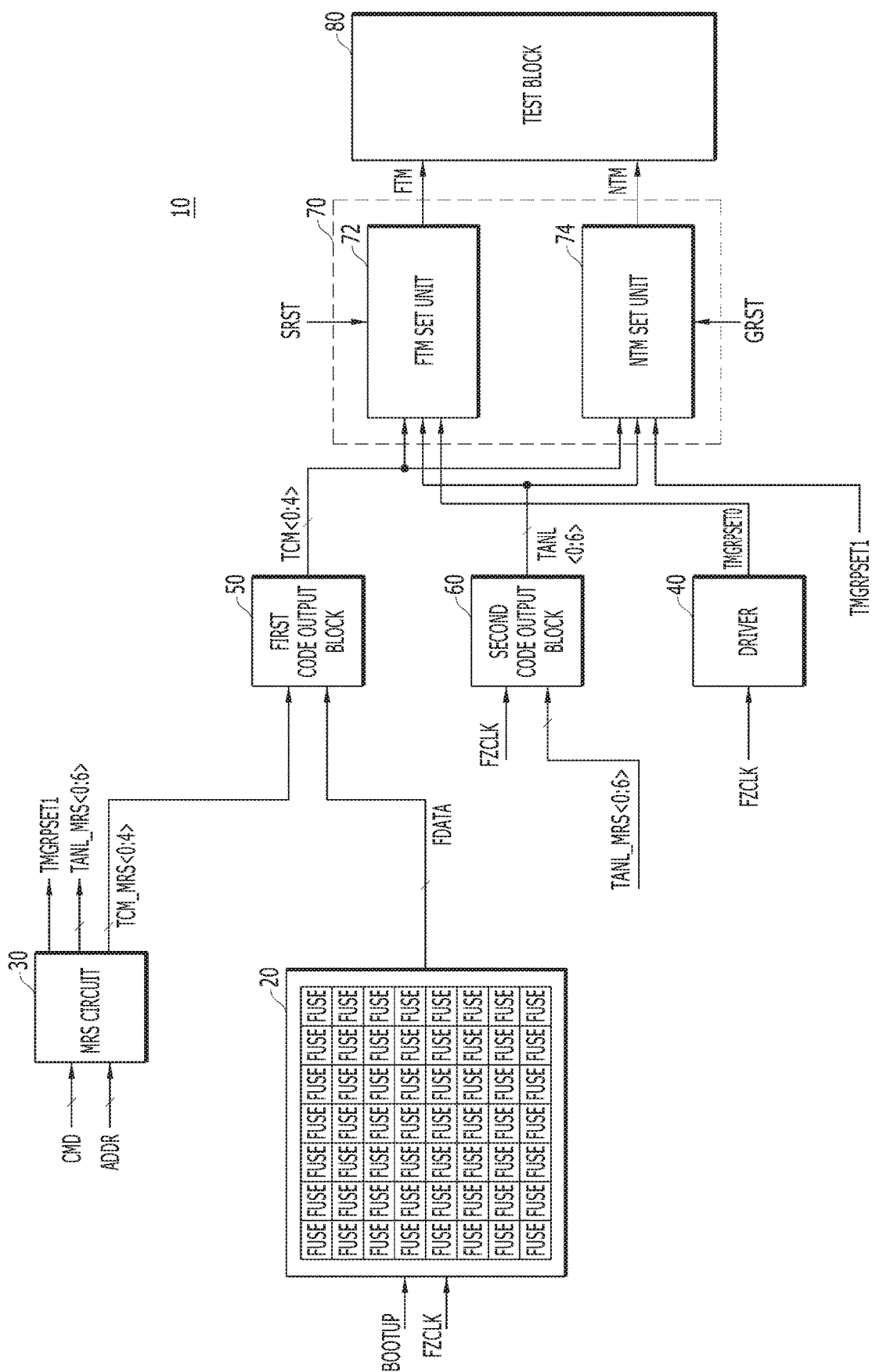
FIG. 1 is a block diagram illustrating a semiconductor device for setting a test mode.

FIG. 1 is a block diagram illustrating a semiconductor device 10 for setting a test mode in accordance with one exemplary embodiment.

Referring to FIG. 1, the semiconductor device 10 may include a fuse circuit 20, a mode register set (MRS) circuit 30, a driver 40, a first code output block 50, a second code output block 60, a test mode set circuit 70, and a test block 80.

The fuse circuit 20 may include a plurality of fuses. The fuse circuit 20 may be embodied, for example, in an array rupture E-fuse or array E-fuse (ARE) circuit including unit fuse cells arranged in an array shape. The fuse circuit 20 may output fuse data FDATA programmed inside based on a boot-up signal BOOTUP activated during a boot-up operation and a clock signal FZCLK.

The MRS circuit 30 may set and store an operation mode of the semiconductor device 10 and output a stored MRS code in response to a combination of a command CMD and an address ADDR inputted from an external device when a specific command, for example, an MRS command, is activated. The MRS code, which is a signal for setting a test mode, may include a second control signal TMGRPSET1, first set code signals TCM_MRS<0:4>, and second set code signals TANL_MRS<0:6>.

The driver 40 may drive the clock signal FZCLK activated during the boot-up operation to output a first control signal TMGRPSET0.

The first code output block 50 may output the fuse data FDATA or the first set code signals TCM_MRS<0:4> as first code signals TCM <0:4>.

The second code output block 60 may output a count signal (not illustrated) generated by counting the clock signal FZCLK or the second set code signals TANL_MRS<0:6> as second code signals TANL<0:6>.

The test mode set circuit 70 may include a FTM set unit 72 and an NTM set unit 74. The FTM set unit 72 may decode the first code signals TCM<0:4> and the second code signals TANL<0:6> to generate a fuse test mode signal FTM based on the first control signal TMGRPSET0. The NTM set unit 74 may decode the first code signals TCM<0:4> and the second code signals TANL<0:6> to generate a normal test mode signal NTM based on the second control signal TMGRPSET1. The FTM set unit 72 may be initialized based on an exclusive reset signal SRST, and the NTM set unit 74 may be initialized based on a global reset signal GRST which may be distinct from the exclusive reset signal SRST. The exclusive reset signal SRST may be inputted for the purpose of resetting the FTM set unit 72, and the global reset signal GRST may be inputted for the purpose of resetting other components of the semiconductor device 10 as well.

The test block 80 may perform a test operation on a test target circuit (not illustrated) based on the fuse test mode signal FTM or the normal test mode signal NTM. The test mode may be largely divided into a fuse test mode where a test operation that is set permanently by cutting the fuses included in the fuse circuit is performed and a normal test mode where a specific test operation desired by the user is performed based on the MRS code stored in the MRS circuit according to the combination of the inputted command CMD and address ADDR. The test block 80 may perform a corresponding test operation when having entered the fuse test mode based on the fuse test mode signal FTM and perform a corresponding test operation when having entered the normal test mode based on the normal test mode signal NTM.

Hereinafter, an operation of the semiconductor device 10 is described with reference to FIGS. 1 to 2B.

Figure 2A:
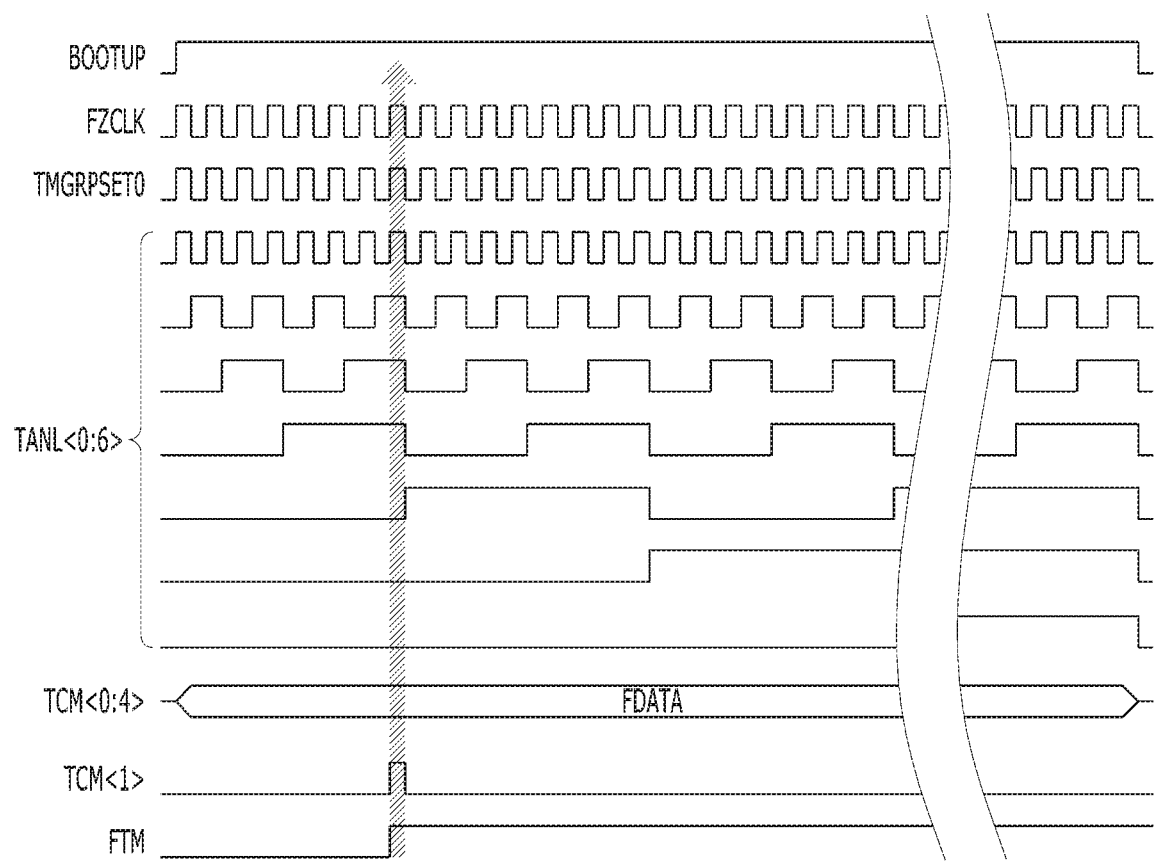
FIGS. 2A and 2B are timing diagrams for describing an operation of a semiconductor device shown in FIG. 1.
Figure 2B:
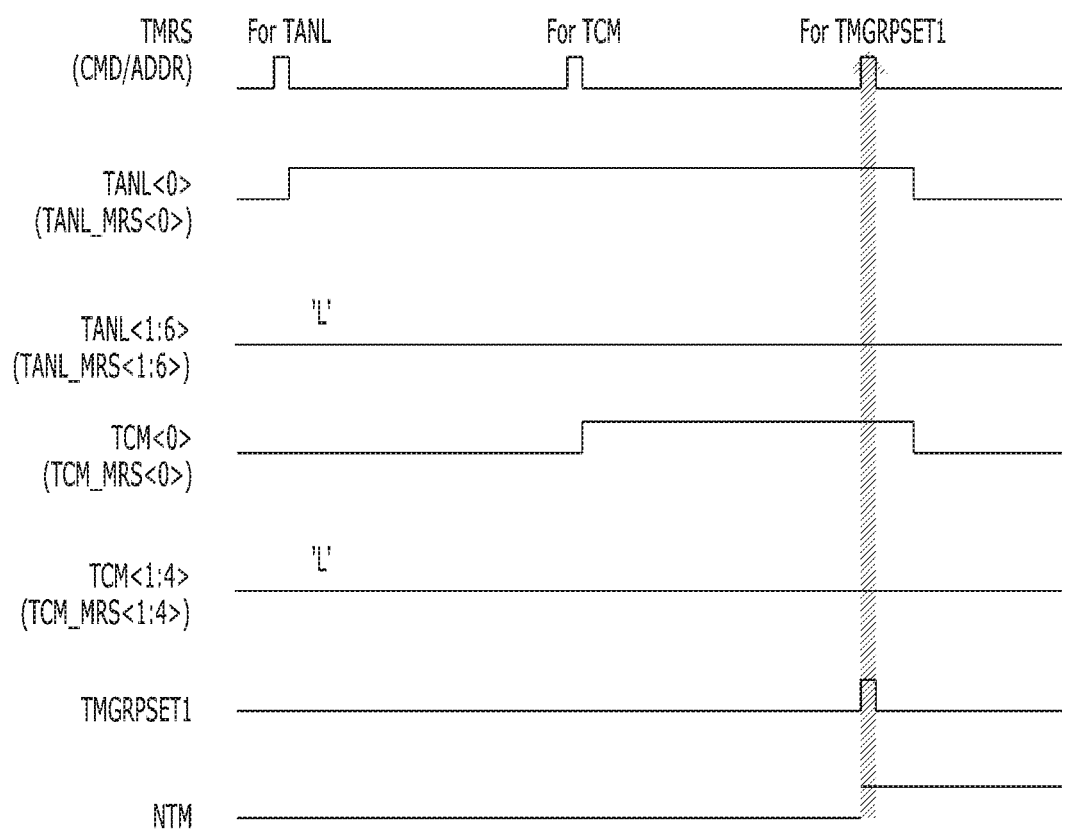

FIGS. 2A and 2B are timing diagrams for describing an operation of the semiconductor device 10 shown in FIG. 1.

Referring to FIG. 2A, an exemplary operation of the semiconductor device 10 to enter or initiate the fuse test mode according to one embodiment is illustrated.

After power is applied, the boot-up signal BOOTUP may be activated, and the clock signal FZCLK may toggle.

The fuse circuit 20 may output the fuse data FDATA based on the boot-up signal BOOTUP and the clock signal FZCLK. The driver 40 may drive the clock signal FZCLK to output the first control signal TMGRPSET0. The second control signal TMGRPSET1, the first set code signals TCM_MRS<0:4>, and the second set code signals TANL_MRS<0:6> that are outputted from the MRS circuit 30 may be deactivated.

The first code output block 50 may output the fuse data FDATA as the first code signals TCM<0:4>, and the second code output block 60 may output the count signal generated by counting the clock signal FZCLK as the second code signals TANL<0:6>.

The FTM set unit 72 may decode the first code signals TCM<0:4> corresponding to the fuse data FDATA and the second code signals TANL<0:6> corresponding to the count signal to generate the fuse test mode signal FTM activated at a predefined time based on the first control signal TMGRPSET0. For example, the FTM set unit 72 may generate the fuse test mode signal FTM activated based on the first control signal TMGRPSET0 if at least one bit, for example, TCM<1>, of the first code signals TCM<0:4> has a high level when a code value of the second code signals TANL<0:6> is "1111000".

The test block 80 may perform the corresponding test operation when entering or initiating the fuse test mode based on the fuse test mode signal FTM. Since the FTM set unit 72 is reset only based on the exclusive reset signal SRST, the fuse test mode signal FTM may be kept in an activation state while the semiconductor device 10 operates unless the exclusive reset signal SRST is inputted (e.g., for exiting test mode).

Referring to FIG. 2B, an operation of the semiconductor device 10 to enter or initiate the normal test mode is illustrated.

When the boot-up operation is completed, the semiconductor device 10 may perform a normal operation corresponding to the command CMD and the address ADDR inputted from the external device. When the semiconductor device 10 is placed in an idle state before or after performing the normal operation, the MRS circuit 30 may output the second control signal TMGRPSET1, the first set code signals TCM_MRS<0:4>, and the second set code signals TANL_MRS<0:6> stored according to the combination of the command CMD and the address ADDR when an MRS command TMRS is activated.

The first code output block 50 may output the first set code signals TCM_MRS<0:4> as the first code signals TCM<0:4>, and the second code output block 60 may output the second set code signals TANL_MRS<0:6> as the second code signals TANL<0:6>.

The NTM set unit 74 may decode the first code signals TCM<0:4> corresponding to the first set code signals TCM_MRS<0:4> and the second code signals TANL<0:6> corresponding to the second set code signals TANL_MRS<0:6> to generate the normal test mode signal NTM based on the second control signal TMGRPSET1. For example, the NTM set unit 74 may generate the normal test mode signal NTM activated based on the second control signal TMGRPSET1 when a specific bit, for example, TANL<0>, of the second code signals TANL<0:6> has a high level and a specific bit, for example, TCM<0>, of the first code signals TCM<0:4> has a high level.

The test block 80 may perform the corresponding test operation when entering or initiating the normal test mode based on the normal test mode signal NTM. Since the NTM set unit 74 is reset whenever the global rest signal GRST is inputted, an activation state of the normal test mode signal NTM may be adjusted so as not to affect the normal operation. Therefore, while the fuse test mode is entered or initiated during the boot-up operation and maintained even after the boot-up operation terminates, the normal test mode may be entered or initiated only when the user applies the command CMD and the address ADDR in the idle state after the boot-up operation terminates, and may be exited so as not to affect the normal operation.

Further, the semiconductor device 10 may perform the test operation by separating the fuse test mode from the normal test mode for various reasons, use the fuse test mode only when a necessary (or general) test mode is set, and use the normal test mode when a specific test mode is set. However, for a system where it is impossible to set the test mode by using an external command and address or when the normal test mode needs to be continuously maintained (for example, when a test operation is performed on a reset circuit), a situation may arise in which the normal test mode has to be set based on the fuse data as well as a combination of the command and address.

Hereinafter, a semiconductor device capable of setting the normal test mode based on the fuse data as well as the combination of the command and address is described in accordance with one or more exemplary embodiments.

Figure 3:
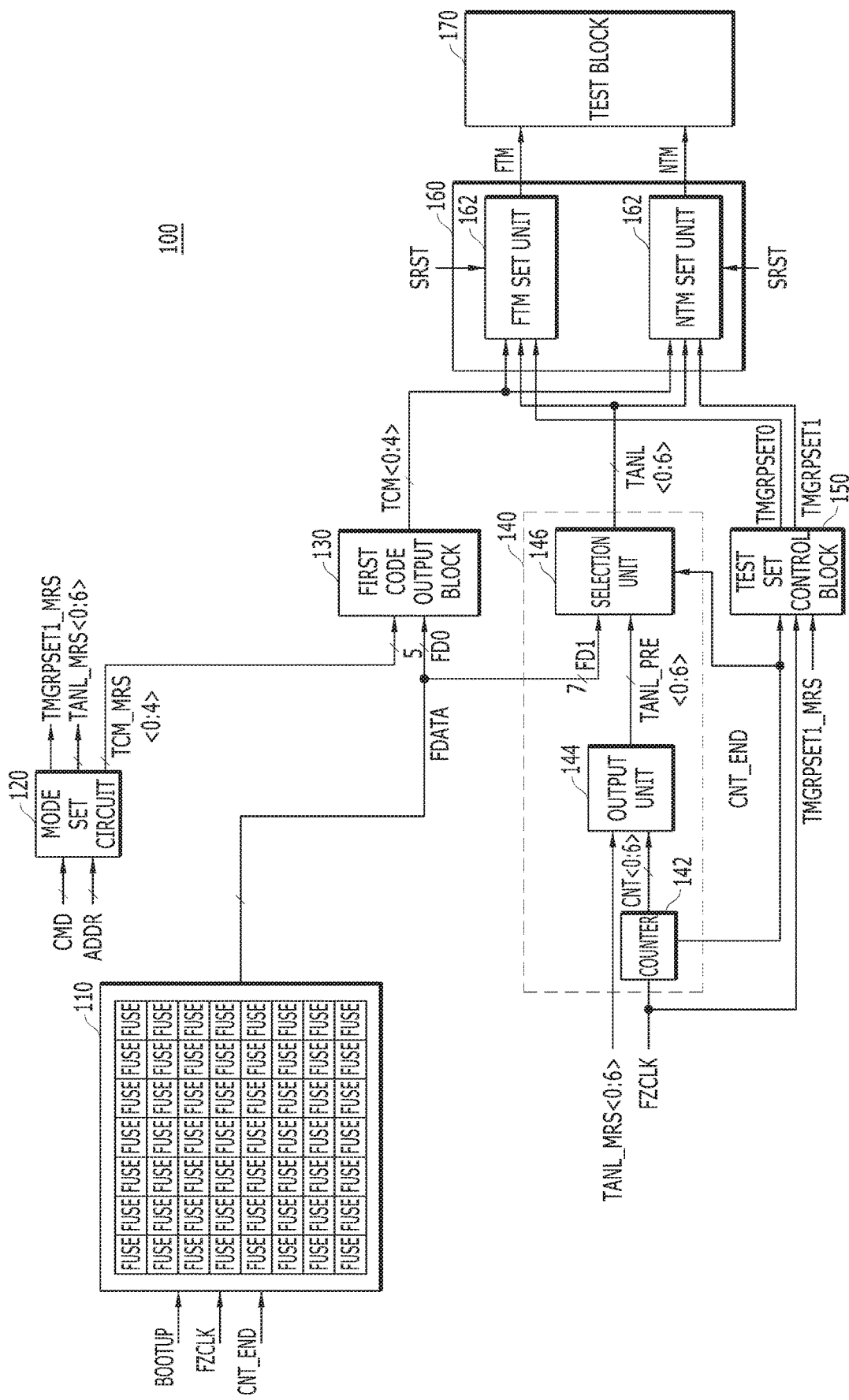
FIG. 3 is a block diagram illustrating a semiconductor device for setting a test mode in accordance with an embodiment of the present invention.

FIG. 3 is a block diagram illustrating a semiconductor device 100 for setting a test mode in accordance with an embodiment of the present invention.

Referring to FIG. 3, the semiconductor device 100 may include a non-volatile memory 110, a mode set circuit 120, a first code output block 130, a second code output block 140, a test set control block 150, a test mode set circuit 160, and a test block 170.

The non-volatile memory 110 may output fuse data FDATA programmed inside based on a clock signal FZCLK during a boot-up operation. The boot-up operation may be defined as a period where a boot-up signal BOOTUP is activated, and the clock signal FZCLK may be a clock that toggles during the boot-up operation. The non-volatile memory 110 may be any one of an array E-fuse (ARE) circuit, a NAND flash memory, a NOR flash memory, an electrically programmable read only memory (EPROM), an electrically erasable and programmable ROM (EEPROM), a ferroelectric random access memory (FRAM), and a magnetic random access memory (MRAM). In accordance with one or more exemplary embodiments of the is present invention, the non-volatile memory 110 may include any suitable hardware elements to store the information on defects of the semiconductor device 100 shown in FIG. 3. For example, when the non-volatile memory 110 includes an array rupture E-fuse circuit, the non-volatile memory 110 may include a plurality of unit fuse cells (not illustrate) disposed at cross points of row lines and column lines that are controlled by address signals and row and column control signals.

The mode set circuit 120 may set and store an operation mode of the semiconductor device 100 and output a stored MRS code in response to a combination of a command CMD and an address ADDR inputted from an external device during a normal operation. The mode set circuit 120 may include an MRS circuit provided inside the semiconductor device 100. In other words, when a specific command, for example, an MRS command, is activated, the mode set circuit 120 may set and store the operation mode of the semiconductor device 100 and output the stored MRS code in response to the combination of the command CMD and the address ADDR inputted from the external device. According to the Joint Electronic Device Engineering Council (JEDEC) standard, the MRS circuit may have data for controlling various modes of the semiconductor device 100, and the operation modes such as CAS latency, burst length, burst sequence, test mode, and vendor special option may be stored as the MRS code. The MRS code for setting a test mode may include a set control signal TMGRPSET1_MRS, first set code signals TCM_MRS<0:4>, and second set code signals TANL_MRS<0:6>. In accordance with one embodiment of the present invention, the mode set circuit 120 may output the set control signal TMGRPSET1_MRS, the first set code signals TCM_MRS<0:4> and the second set code signals TANL_MRS<0:6> that are stored according to the combination of the command CMD and the address ADDR inputted in an idle state during the normal operation.

The first code output block 130 may output the first set code signals TCM_MRS<0:4> or the fuse data FDATA as first code signals TCM<0:4>. The first code output block 130 may include a logic gate which performs a logic OR operation on input signals.

The second code output block 140 may generate count signals CNT<0:6> by counting the clock signal FZCLK and output second code signals TANL<0:6> by selecting one of the count signals CNT<0:6> and the fuse data FDATA based on a counting termination signal CNT_END during the boot-up operation. Further, the second code output block 140 may output the second set code signals TANL_MRS<0: 6> as the second code signals TANL<0:6> during the normal operation.

The test set control block 150 may output the clock signal FZCLK as a first control signal TMGRPSET0 or a second control signal TMGRPSET1 based on the counting termination signal CNT_END during the boot-up operation, and output the set control signal TMGRPSET1_MRS as the second control signal TMGRPSET1 during the normal operation.

The test mode set circuit 160 may decode the first code signals TCM<0:4> and the second code signals TANL<0:6> to generate a fuse test mode signal FTM and a normal test mode signal NTM based on the first and second control signals TMGRPSET0 and TMGRPSET1.

More specifically, the test mode set circuit 160 may include a FTM set unit 162 and an NTM set unit 164.

The FTM set unit 162 may decode the first code signals TCM<0:4> and the second code signals TANL<0:6> to generate the fuse test mode signal FTM based on the first control signal TMGRPSET0 to enter or initiate the fuse test mode. The NTM set unit 164 may decode the first code signals TCM<0:4> and the second code signals TANL<0:6> to generate the normal test mode signal NTM based on the second control signal TMGRPSET1 to enter or initiate the normal test mode. In accordance with one embodiment of the present invention, the FTM set unit 162 and the NTM set unit 164 may be simultaneously reset based on an exclusive reset signal SRST which is distinct from the global reset signal GRST used to reset the NTM set unit 74 shown in FIG. 1. Accordingly, the normal test mode signal NTM as well as the fuse test mode signal FTM may be kept in an activation state while the semiconductor device 100 operates unless the exclusive reset signal SRST is inputted to exit the test mode.

The test block 170 may perform a test operation on a test target circuit (not illustrated) based on the fuse test mode signal FTM or the normal test mode signal NTM. The test block 170 may perform a corresponding test operation when entering or initiating the fuse test mode based on the fuse test mode signal FTM and perform a corresponding test operation when entering or initiating the normal test mode based on the normal test mode signal NTM.

According to one embodiment of the present invention, during the boot-up operation, the non-volatile memory 110 may output first data FD0 of N bits as the fuse data FDATA based on the counting termination signal CNT_END and subsequently output the first data FD0 of the N bits and second data FD1 of M bits as the fuse data FDATA. N may correspond to the number of bits of the first code signals TCM<0:4> (e.g., 5), and M may correspond to the number of bits of the second code signals TANL<0:6> (e.g., 7). The non-volatile memory 110 may include N*2^M unit cells for the fuse test mode and (N+M)*X unit cells for the normal test mode, where X is the number of times that the second control signal TMGRPSET1 is activated during the boot-up operation. For example, when the number of times that the second control signal TMGRPSET1 is activated during the boot-up operation is 8, the non-volatile memory 110 may include at least 736 (=640+96) unit cells.

The first code output block 130 may output the first data FD0 of the N bits as the first code signals TCM<0:4> during the boot-up operation, and output the first set code signals TCM_MRS<0:4> as the first code signals TCM<0:4> during the normal operation. The second code output block 140 may select one of the count signals CNT<0:6> of the M bits and the second data FD1 of the M bits and output the one as the second code signals TANL<0:6> based on the counting termination signal CNT_END during the boot-up operation, and output the second set code signals TANL_MRS<0:6> as the second code signals TANL<0:6> during the normal operation.

More specifically, the second code output block 140 may include a counter 142, an output unit 144, and a selection unit 146.

The counter 142 may count the clock signal FZCLK to generate the count signals CNT<0:6> of the M bits, and output the counting termination signal CNT_END when the count signals CNT<0:6> reach a maximum value of $2^M$. The output unit 144 may generate preliminary code signals TANL_PRE<0:6> based on the second set code signals TANL_MRS<0:6> or the count signals CNT<0:6>. The selection unit 146 may select one of the preliminary code signals TANL_PRE<0:6> and the second data FD1 of the M bits and output the one as the second code signals TANL<0:6> based on the counting termination signal CNT_END.

Hereinafter, exemplary configurations of the semiconductor device 100 shown in FIG. 3 are described with reference to FIGS. 4 to 7 in accordance with one or more embodiments.

Figure 4:
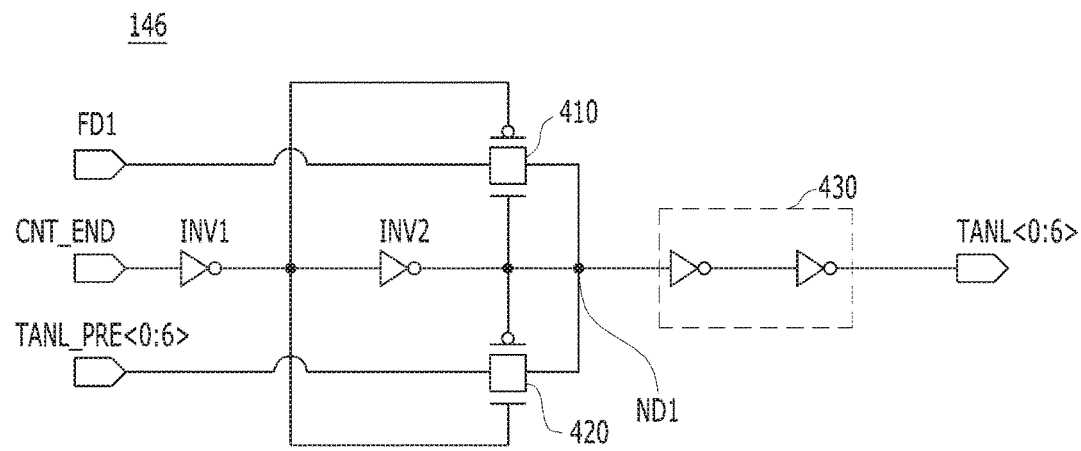
FIG. 4 is a circuit diagram illustrating a selection unit of a second code output block shown in FIG. 3.

FIG. 4 is a circuit diagram illustrating the selection unit 146 of the second code output block shown 140 in FIG. 3.

Referring to FIG. 4, the selection unit 146 may include a first inverter INV1, a second inverter INV2, a first transmitter 410, a second transmitter 420, and a buffer 430.

The first inverter INV1 may invert the counting termination signal CNT_END, and the second inverter INV2 may invert an output of the first inverter INV1. The first transmitter 410 may transmit the second data FD1 to a common node ND1 based on an output of the second inverter INV2. The second transmitter 420 may transmit the preliminary code signals TANL_PRE<0:6> to the common node ND1 based on the output of the first inverter INV1. The buffer 430 may buffer a signal of the common node ND1 to output the second code signals TANL<0:6>.

The first transmitter 410 and the second transmitter 420 may be embodied as transmitting gates, and the buffer 430 may be embodied as an inverter chain. Although the transmitting gates of the respective transmitters are shown as one in FIG. 4, the transmitting gates of the respective transmitters may be provided as many as the number of bits of an input signal.

As described above, the selection unit 146 may output the preliminary code signals TANL_PRE<0:6> as the second code signals TANL<0:6> when the counting termination signal CNT_END is deactivated, and output the second data FD1 as the second code signals TANL<0:6> when the counting termination signal CNT_END is activated.

Figure 5:
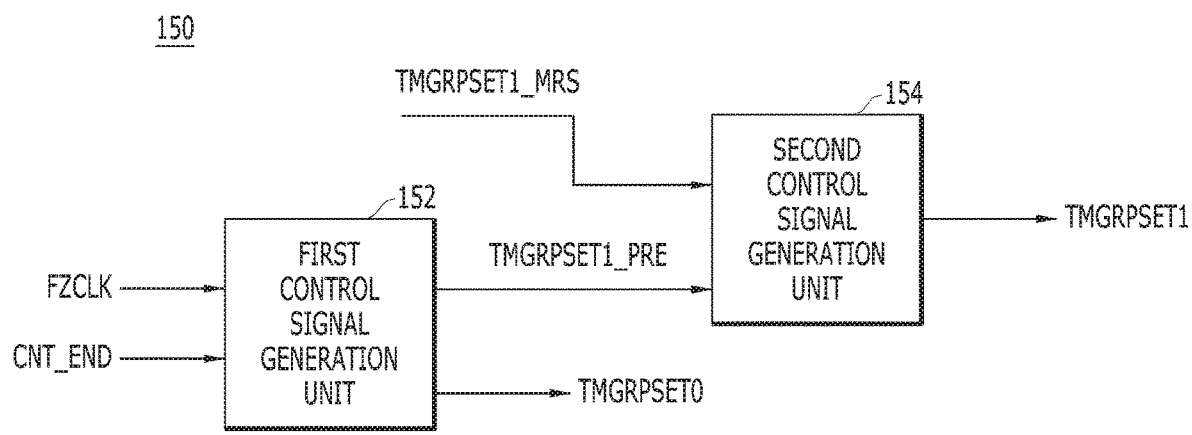
FIG. 5 is a block diagram illustrating a test set control block shown in FIG. 3.
Figure 6:
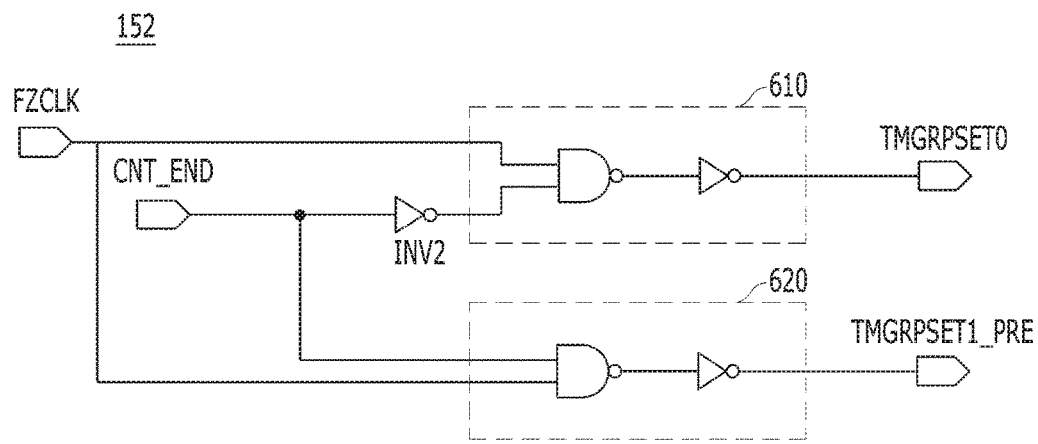
FIG. 6 is a circuit diagram illustrating a first control signal generation unit shown in FIG. 5.

FIG. 5 is a block diagram illustrating the test set control block 150 shown in FIG. 3. FIG. 6 is a circuit diagram illustrating a first control signal generation unit 152 shown in FIG. 5.

Referring to FIG. 5, the test set control block 150 may include a first control signal generation unit 152 and a second control signal generation unit 154.

The first control signal generation unit 152 may generate the clock signal FZCLK as the first control signal TMGRPSET0 when the counting termination signal CNT_END is deactivated, and generate the clock signal FZCLK as a preliminary control signal TMGRPSET1_PRE when the counting termination signal CNT_END is activated. The second control signal generation unit 154 may output the set control signal TMGRPSET1_MRS or the preliminary control signal TMGRPSET1_PRE as the second control signal TMGRPSET1. For example, the second control signal generation unit 154 may include a first buffer for buffering the set control signal TMGRPSET1_MRS, a second buffer for buffering the preliminary control signal TMGRPSET1_PRE, and an outputter for driving a common node of the first and second buffers to output the second control signal TMGRPSET1.

Referring to FIG. 6, the first control signal generation unit 152 may include a third inverter INV3, a first signal aggregate part 610, and a second signal aggregate part 620.

The third inverter INV3 may invert the counting termination signal CNT_END. The first signal aggregate part 610 may perform a logic AND operation on an output of the third inverter INV3 and the clock signal FZCLK to generate as the first control signal TMGRPSET0. The second signal aggregate part 620 may perform a logic AND operation on the counting termination signal CNT_END and the clock signal FZCLK to generate as the preliminary control signal TMGRPSET1_PRE.

As described above, the test set control block 150 may output the clock signal FZCLK as the first control signal TMGRPSET0 when the counting termination signal CNT_END is deactivated and output the clock signal FZCLK as the second control signal TMGRPSET1 when the counting termination signal CNT_END is activated, during the boot-up operation. Besides, the test set control block 150 may output the set control signal TMGRPSET1_MRS as the second control signal TMGRPSET1 during the normal operation.

Figure 7:
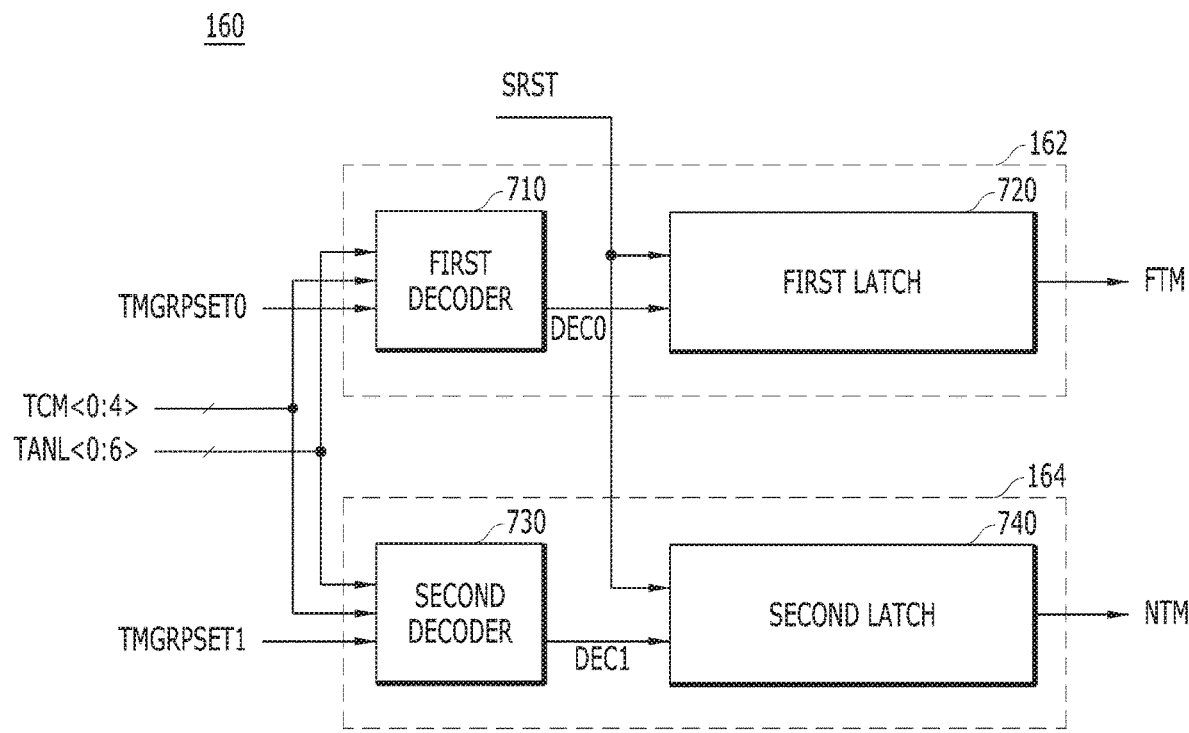
FIG. 7 is a block diagram illustrating a test mode set circuit shown in FIG. 3.

FIG. 7 is a block diagram illustrating the test mode set circuit 160 shown in FIG. 3.

Referring to FIG. 7, the FTM set unit 162 of the test mode set circuit 160 may include a first decoder 710 and a first latch 720.

The first decoder 710 may decode the first code signals TCM<0:4> and the second code signals TANL<0:6> to output a first decoding signal DEC0 based on the first control signal TMGRPSET0. The first latch 720 may store the first decoding signal DEC0 as the fuse test mode signal FTM.

The NTM set unit 164 of the test mode set circuit 160 may include a second decoder 730 and a second latch 740.

The second decoder 730 may decode the first code signals TCM<0:4> and the second code signals TANL<0:6> to output a second decoding signal DEC1 based on the second control signal TMGRPSET1. The second latch 740 may store the second decoding signal DEC1 as the normal test mode signal NTM.

The first latch 720 and the second latch 740 may be simultaneously reset based on the exclusive reset signal SRST which is distinct from the global reset signal GRST shown in FIG. 1. Accordingly, the normal test mode signal NTM as well as the fuse test mode signal FTM may be kept in an activation state while the semiconductor device 100 operates unless the exclusive reset signal SRST is inputted to exit the test mode.

Hereinafter, an exemplary operation of the semiconductor device 100 is described with reference to FIGS. 3 to 9B according to one or more embodiments.

Figure 9A:
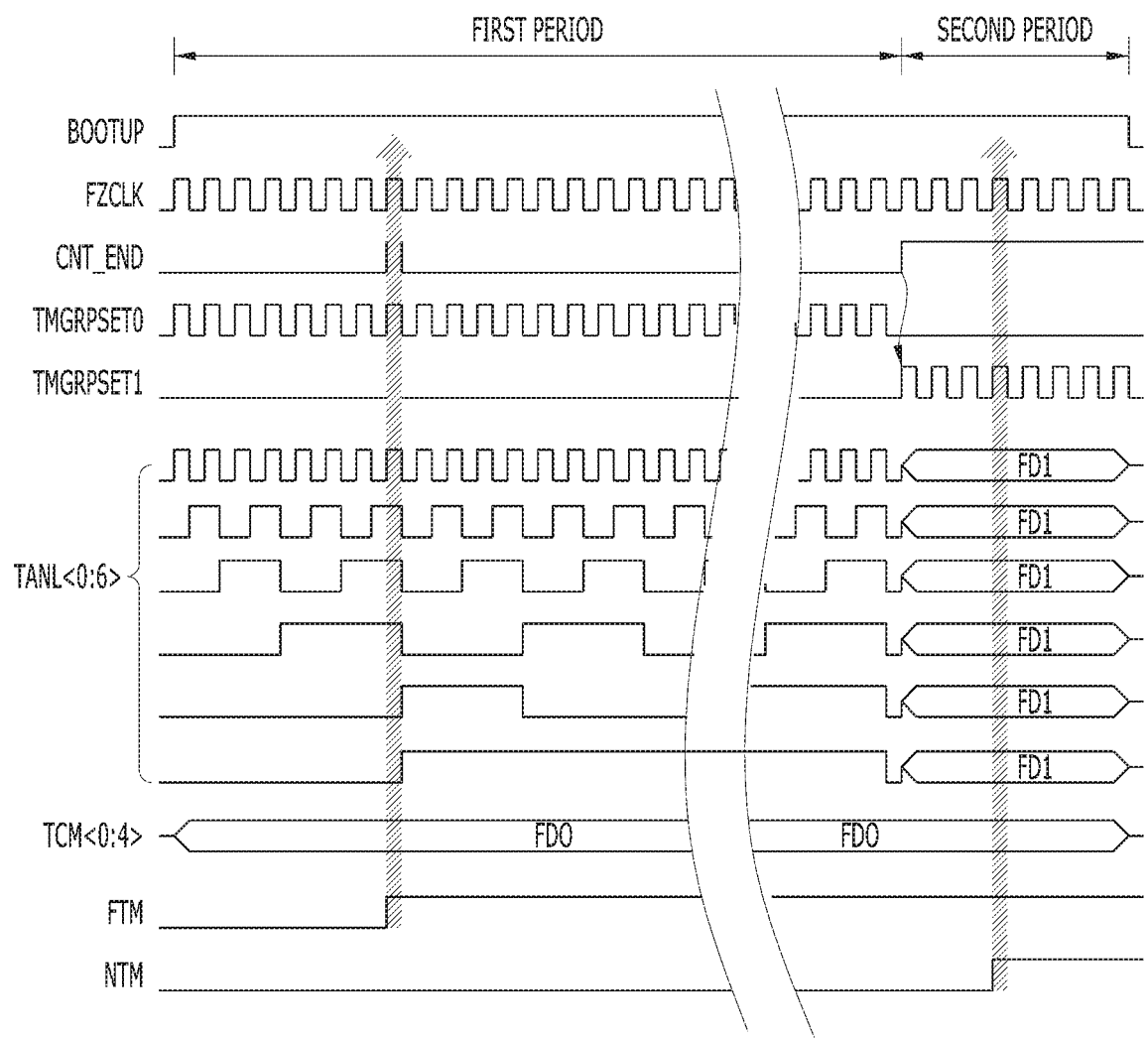
FIGS. 9A and 9B are timing diagrams for describing a method of setting a test mode of a semiconductor device shown in FIG. 8.
Figure 9B:
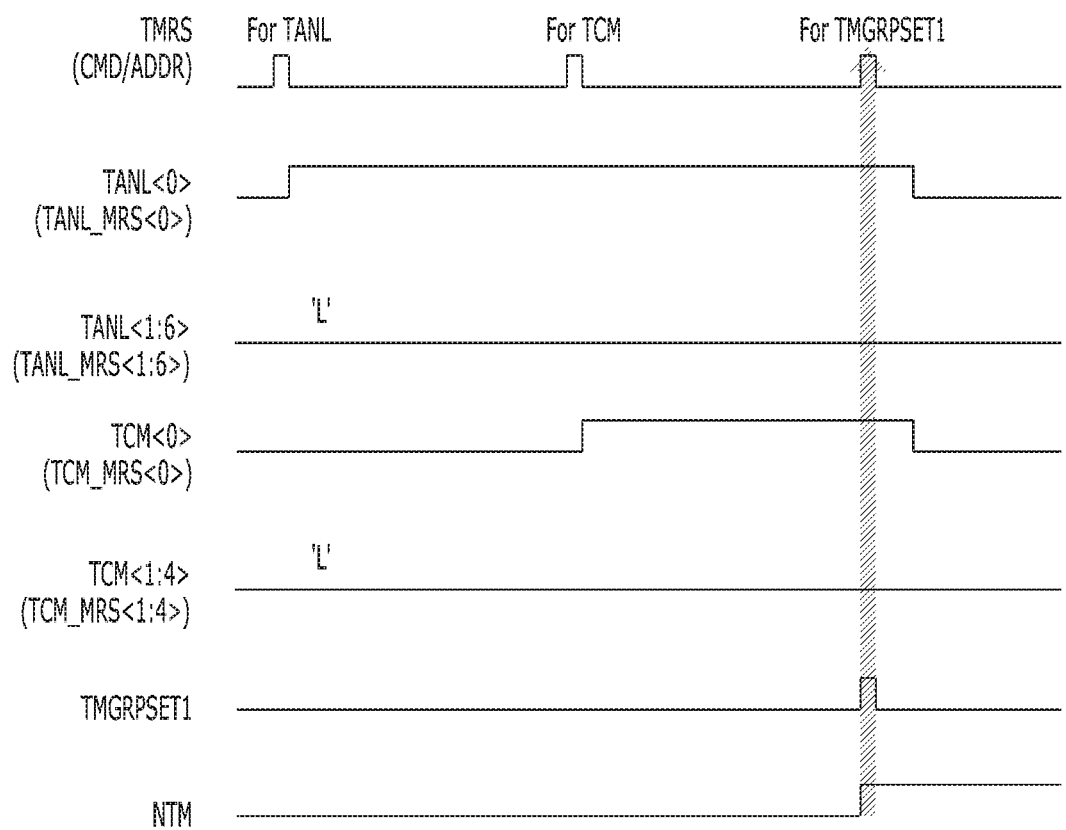

FIG. 8 is a table for describing a method of setting the test mode of the semiconductor device 100 in accordance with an embodiment of the present invention. FIG. 9A is a timing diagram for describing the boot-up operation shown in FIG. 8, and FIG. 9B is a timing diagram for describing the normal operation shown in FIG. 8.

Referring to FIG. 8, the test mode may be largely divided into a fuse test mode where a test operation, which is permanently set, is performed on the fuse data FDATA outputted from the non-volatile memory 110 based on the clock signal FZCLK during the boot-up operation and a normal test mode where a specific test operation desired by the user is performed according to a combination of the command CMD and address ADD inputted from an external device during the normal operation. In accordance with one embodiment of the present invention, the boot-up operation may be divided into a first period and a second period, the fuse test mode may be set during the first period of the boot-up operation, and the normal test mode may be further set during the second period of the boot-up operation. The first and second periods of the boot-up operation may be divided based on the counting termination signal CNT_END. In other words, when the count signals CNT<0:6> of the M bits generated by counting the clock signal FZCLK reach the maximum value of $2^M$, the counting termination signal CNT_END may be activated, whereby the first period of the boot-up operation may terminate, and the second period may start.

Referring to FIG. 9A, during the first period of the boot-up operation, the first control signal TMGRPSET0 may correspond to the clock signal FZCLK, the first code signals TCM<0:4> may correspond to the first data FD0 of the N bits among the fuse data FDATA, and the second code signals TANL<0:6> may correspond to the count signals CNT<0:6> of the M bits. Accordingly, if at least one bit of the first code signals TCM<0:4> has a high level when the second code signals TANL<0:6> has a predefined value, the FTM set unit 162 may activate and output the fuse test mode signal FTM based on the first control signal TMGRPSET0. For example, the FTM set unit 162 may generate the fuse test mode signal FTM activated based on the first control signal TMGRPSET0 if at least one bit of the first code signals TCM<0:4> has the high level when a code value of the second code signals TANL<0:6> is "1111000".

Although the fuse test mode signal FTM is shown as a single signal in FIG. 9A, the fuse test mode signal FTM may be composed of a plurality of signals according to the number of bits of the first code signals TCM<0:4> and the second code signals TANL<0:6>. For example, when the first code signals TCM<0:4> have 5 bits and the second code signals TANL<0:6> have 7 bits, the fuse test mode signal FTM may be composed of maximum 640 (=5*2^7) signals, thereby determining to initiate maximum 640 fuse test modes.

Since the first code signals TCM<0:4>, i.e., the fuse data FDATA has to be read out whenever the code value of second code signals TANL<0:6> varies, the non-volatile memory 110 may include N*2^M unit cells for the fuse test mode. For example, during the first period shown in FIG. 9A, the non-volatile memory 110 may include 640 (=5*128) unit cells for the normal test mode.

When the count signals CNT<0:6> reach a maximum value of 128, the counting termination signal CNT_END may be activated, whereby the first period of the boot-up operation may terminate and the second period may start.

During the second period of the boot-up operation, the second control signal TMGRPSET1 may correspond to the clock signal FZCLK, the first code signals TCM<0:4> may correspond to the first data FD0 of the N bits among the fuse data FDATA, and the second code signals TANL<0:6> may correspond to the second data FD1 of the M bits.

Accordingly, when at least one bit of the first code signals TCM<0:4> has a high level, and at least one bit of the second code signals TANL<0:6> has the high level, the NTM set unit 164 may activate and output the normal test mode signal NTM based on the second control signal TMGRPSET1.

Although the normal test mode signal NTM is shown as a single signal in FIG. 9A, the normal test mode signal NTM may be composed of a plurality of signals according to the number of bits of the first code signals TCM<0:4>. When the first code signals TCM<0:4> have 5 bits, the normal test mode signal NTM during the boot-up operation may be composed of maximum 5*X signals, where X is the number of times that the second control signal TMGRPSET1 is activated during the boot-up operation or the number of times that the clock signal FZCLK is activated during the second period. For example, during the second period shown in FIG. 9A, since the second control signal TMGRPSET1 has 8 periods, the normal test mode signal NTM during the boot-up operation may determine to initiate maximum 40 test modes. In this case, since the normal test mode signal NTM set during the second period uses the existing latch for storing the normal test mode signal NTM set during the normal operation, an additional latch is not needed, which can save an additional occupying area.

Since a single test mode is set when the first code signals TCM<0:4> and the second code signals TANL<0:6>, i.e., the fuse data FDATA are read out once, the non-volatile memory 110 may include (N+M)*X unit cells for the normal test mode. For example, during the second period shown in FIG. 9A, since the second control signal TMGRPSET1 has the 8 periods, the non-volatile memory 110 may include 96 (=12*8) unit cells for the normal test mode. The number of the unit cells required for the normal test mode, that is, (N+M)*X may be adjusted to be smaller than the number of the unit cells required for the fuse test mode, that is, N*2^M. In accordance with one embodiment of the present invention, when the normal test mode is set during the boot-up operation, the fuse data, i.e., the second data FD1 may be used instead of the existing count signals CNT<0:6>. Consequently, the number of the unit cells to be included in the non-volatile memory 110 may be reduced.

When the boot-up operation is completed, the semiconductor device 100 may perform the normal operation corresponding to the command CMD and address ADDR inputted from the external device.

Referring to FIG. 9B, the mode set circuit 120 may output the set control signal TMGRPSET_MRS, the first set code signals TCM_MRS<0:4>, and the second set code signals TANL_MRS<0:6> that are stored according to the combination of the command CMD and the address ADDR inputted in the idle state during the normal operation.

During the normal operation, the second control signal TMGRPSET01 may correspond to the set control signal TMGRPSET1_MRS, the first code signals TCM<0:4> may correspond to the first set code signals TCM_MRS<0:4>, and the second code signals TANL<0:6> may correspond to the second set code signals TANL_MRS<0:6>. Accordingly, when at least one bit of the first code signals TCM<0:4> has a high level and at least one bit of the second code signals TANL<0:6> has the high level, the NTM set unit 164 may activate and output the normal test mode signal NTM.

Although the normal test mode signal NTM is shown as a single signal in FIG. 9B, the normal test mode signal NTM may be composed of a plurality of signals according to the number of bits of the first code signals TCM<0:4> and that of the second code signals TANL<0:6>. For example, when the first code signals TCM<0:4> have 5 bits, and the second code signals TANL<0:6> have 7 bits, the normal test mode signal NTM may be composed of maximum 640 (=5*2^7) signals, thereby determining to initiate 640 test modes.

As described above, the test mode set circuit in accordance with one embodiment of the present invention may set the normal test mode during the boot-up operation as well as the normal operation with minimum unit cells of the non-volatile without the need of an additional latch circuit. Thus, even for a system where it is impossible to set the test mode by using an external command and address or even when the normal test mode needs to be continuously maintained (for example, when a test operation is performed on a reset circuit), the normal test mode may keep being used, and therefore adaptability to various environments may be improved.

In accordance with the embodiments of the present invention, the test mode may be selectively applied to the semiconductor device, whereby an increase in the size of the circuit may be minimized, and the adaptability to various environments may be improved.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the spirit and/or scope of the present invention as defined by the following claims.

Also, dispositions and types of the logic gates and transistors described in the aforementioned embodiments may be implemented differently based on the polarity of the inputted signal.

What is claimed is:

1. A test mode set circuit comprising:
    a first test mode set circuit configured to set entry into a first test mode based on a clock signal and first data outputted from a non-volatile memory during a first period of a boot-up operation; and
    a second test mode set circuit configured to set entry into a second test mode based on the first data and second data outputted from the non-volatile memory during a second period of the boot-up operation, or set entry into the second test mode based on a set signal generated by a combination of a command and an address during a normal operation,
    wherein the first test mode set circuit and the second test mode circuit are further configured to set exit from the first and second test modes in response to an exclusive reset signal which is distinct from a global reset signal.

2. The test mode set circuit of claim 1, wherein the first and second periods of the boot-up operation are divided on a basis of a time when a value obtained by counting the clock signal reaches a maximum value.

3. The test mode set circuit of claim 1, wherein the second test mode set circuit sets entry into the second test mode based on the set signal generated by the combination of the command and the address in an idle state during the normal operation.

4. The test mode set circuit of claim 1, wherein the first and second test mode set circuits are reset based on the exclusive reset signal which is distinct from the global reset signal.

5. The test mode set circuit of claim 1, wherein the first test mode set circuit sets entry into the first test mode if at least one bit of the first data of N bits has a high level when count signals of M bits generated by counting the clock signal have a defined value during the first period of the boot-up operation, and
    wherein the second test mode set circuit sets entry into the second test mode if at least one bit of the first data of the N bits has a high level and at least one bit of the second data of M bits has the high level during the second period of the boot-up operation.

6. The test mode set circuit of claim 1, wherein the non-volatile memory includes N*2^M unit cells for the first test mode set circuit and (N+M)*X unit cells for the second test mode set circuit, where N is a number of bits of the first data, M is a number of bits of the second data, and X is a number of times that the clock signal is activated during the second period of the boot-up operation.

7. A semiconductor device comprising:
a non-volatile memory configured to output fuse data that is programmed based on a clock signal during a boot-up operation;
a mode set circuit configured to output a set control signal, first set code signals and second set code signals that are stored according to a combination of a command and an address during a normal operation;
a first code output circuit configured to output the first set code signals or the fuse data as first code signals;
a second code output block configured to generate count signals by counting the clock signal during the boot-up operation, select one of the count signals and the fuse data and output a selected one as second code signals based on a counting termination signal, and output the second set code signals as the second code signals during the normal operation;
a test set control circuit configured to output the clock signal as a first control signal or a second control signal based on the counting termination signal during the boot-up operation and output the set control signal as the second control signal during the normal operation; and
a test mode set circuit configured to control entry into a first test mode or a second test mode according to the first code signals and the second code signals that are decoded based on the first control signal and the second control signal,
wherein the test mode set circuit is further configured to control exiting the first and second test modes in response to an exclusive reset signal which is distinct from a global reset signal.

8. The semiconductor device of claim 7, wherein the mode set circuit outputs the set control signal, the first set code signals, and the second set code signals that are stored according to the combination of the command and the address in an idle state during the normal operation.

9. The semiconductor device of claim 7, wherein the first code output circuit outputs first data of N bits among the fuse data as the first code signals during the boot-up operation and outputs the first set code signals as the first code signals during the normal operation.

10. The semiconductor device of claim 9, wherein the second code output circuit includes:
a counter configured to count the clock signal to generate the count signals of M bits and output the counting termination signal when the count signals reach a maximum value;
an output circuit configured to generate the second set code signals or the count signals as preliminary code signals; and
a selection circuit configured to select one of the preliminary code signals and second data of M bits among the fuse data and output a selected one as the second code signals based on the counting termination signal.

11. The semiconductor device of claim 10, wherein the non-volatile memory includes N*2^M unit cells for the first test mode and (N+M)*X unit cells for the second test mode, where X is the number of times that the second control signal is activated during the boot-up operation.

12. The semiconductor device of claim 7, wherein the test mode set circuit includes:
a first test mode set circuit configured to control entry into the first test mode according to the first code signals and the second code signals that are decoded based on the first control signal; and
a second test mode set circuit configured to control entry into the second test mode according to the first code signals and the second code signals that are decoded based the second control signal.

13. The semiconductor device of claim 12, wherein the first and second test mode set circuits are reset based on the exclusive reset signal which is distinct from the global reset signal.

14. The semiconductor device of claim 7, wherein the test set control circuit includes:
a first control signal generation circuit configured to generate the clock signal as the first control signal when the counting termination signal is deactivated and generate the clock signal as the preliminary code signals when the counting termination signal is activated; and
a second control signal generation circuit configured to output the set control signal or the preliminary code signals as the second control signal.

15. A method of setting a test mode, comprising:
setting entry into a first test mode based on count signals generated by counting a clock signal and first data outputted from a non-volatile memory during a first period of a boot-up operation;
activating a counting termination signal when the count signals reach a specific value;
setting entry into a second test mode based on the first data and second data outputted from the non-volatile memory during a second period of the boot-up operation based on the counting termination signal;
setting re-entry into the second test mode based on a set signal generated according to a combination of a command and an address during a normal operation, and
exiting the first and second test modes in response to an exclusive reset signal which is distinct from a global reset signal.

16. The method of claim 15, wherein the re-entering of the second test mode is carried out in an idle state during the normal operation.

17. The method of claim 15, wherein the entering of the first test mode includes:
setting entry into the first test mode if at least one bit of the first data of N bits has a high level when the count signals of M bits have a predefined value.

18. The method of claim 17, wherein the entering of the second test mode includes:
setting entry into the second test mode when at least one bit of the first data of the N bits has the high level, and at least one bit of the second data of M bits has the high level.

19. The method of claim 15, wherein the non-volatile memory includes N*2^M unit cells for the first test mode and (N+M)*X unit cells for the second test mode, where N is a number of bits of the first data, M is a number of bits of the second data, and X is a number of times that the clock signal is activated during the second period of the boot-up operation.

* * * * *